METHOD FOR FORMING STAMPED ELECTRICAL CIRCUITS

Filed March 28, 1962

INVENTOR.
HARRY L. HILDEBRAND
BY
Colman, Ward & Kay
ATTORNEY

United States Patent Office 3,214,315
Patented Oct. 26, 1965

3,214,315

METHOD FOR FORMING STAMPED ELECTRICAL CIRCUITS

Harry L. Hildebrand, Norristown, Pa., assignor of one-half to Burton Solomon and Allen M. Brass, both of Southfield, Mich.

Filed Mar. 28, 1962, Ser. No. 183,297
2 Claims. (Cl. 156—222)

This invention relates to a method for forming electrically conductive circuits on non-conductive bases and more particularly to such method and apparatus wherein the conductive portion of the circuitry is initially formed by stamping from a conductive sheet.

In recent years extensive use has been made of "printed circuits" wherein the wires which normally connect the various elements of an electrical circuit are replaced by conductive lines formed on non-conductive substrates either by actual printing methods or by etching away the undesired portions of a thin conductive surface formed on the substrate. Such techniques provide extensive advantages of economy, reliability, and size over the hand-wiring techniques. It has also been proposed that such circuits be formed by suspending a sheet of conductive material having a coating of thermosetting adhesive above a non-conductive base, and then striking the foil with a heated die so as to simultaneously separate the undesired portions of the foil from those which will form the ultimate circuit and to heat the circuit portions of the foil so as to cause them to adhere to the base. Such a technique is disclosed in U.S. Patent No. 2,622,054. That patent also suggests the possibility of shaping the die so that the edges of the circuit sections are turned down into the plastic material. In this manner the thermosetting adhesive may be dispensed with and adhesion between the circuit and the insulating board may be attained by the plastic of the board being melted to a point where it flows about the down-turned edges of the circuit.

While the stamped circuit technique would appear to have advantages over printed circuit techniques in that relatively thick conducting layers may be formed and the mass production rates of stamping techniques may be achieved, the fact that the heated die must be maintained in contact with the circuit for a sufficient period of time to set the adhesive and/or cause the plastic to flow about the circuit edges actually makes it a very slow process and a large number of expensive dies must be employed if such circuits are to be produced in quantities.

The present invention constitutes an improvement on this stamped circuit technique which obviates the need for heating the unit in the stamping die for a sufficient time to cause the plastic to flow or to cause the adhesive to set. In its broadest form, it comprises the steps of first disposing the conductive sheet over a non-conductive substrate; stamping the sheet with a cutting die adapted to separate the circuit portions from the non-circuit portions; then removing the non-circuit portions; and finally placing the circuit portion of the conductive material and the base material in a flat heating press for a sufficient period of time to at least cause the circuit portion to become adhered to the base. While, as in the prior art, this adhesion may be as the result of thermosetting adhesives disposed between the circuit and the base or as a result of the plastic flowing about the circuit portion, in a preferred embodiment the adhesion results from the use of an uncured thermosetting plastic base such as a phenolic resin formed about a fiber or fabric backing. The foil is initially placed over an uncured base section and the base does not become cured until disposed in the press with the conductive circuit portion, following the cutting action.

In addition to the economy achieved by maximum utilization of the expensive cutting dies, the present process provides two major advantages over previous stamped circuit techniques. The first advantage results from the fact that the conductive circuit portion is only loosely attached to the base following removal from the cutting die. This allows the unit to undergo an intermediate forming process which may take the form of a drawing operation wherein both the circuit and the base are deformed along lines having components perpendicular to the normal plane of the base so as to form a non-planar unit extending in the third dimension. In this manner printed circuits having an extension in three dimensions may be formed. The possibility of using this intermediate three-dimensional forming process results from the fact that the circuit and the base are only loosely attached to one another when they were removed from the die-cutting operation. They each may then be drawn in the three-dimensional forming operation in accordance with their own modulus of elasticity. Were the units to be subjected to a drawing process following the complete adhesion of the circuit to the base, as results from use of the prior art method, either the circuit or the base would tear when they were jointly subjected to extensive drawing forces. Using the present method, the circuit may slip with respect to the base and thereby conform to the necessary draw. This process involving the intermediate drawing step represents a narrower embodiment of my invention.

Another advantage of my process over prior stamped circuit techniques results from the fact that the cut-out circuit and base may be subjected to pressures in the heating operation which will allow the circuit to be pressed to a level wherein its upper edge is flush with the surface of the base. This eliminates the danger of the circuit being torn during use by actions which might catch a normally extending edge of the circuit. By imbedding the circuit within the base and making their upper surfaces flush, the circuit may only be broken by a mechanical action which also breaks the base. This method of forming and the circuit formed thereby constitutes a further novel aspect of my invention.

It is therefore seen to be a primary object of the present invention to provide a method of forming stamped circuits wherein (a) a sheet of conductive material is first stamped, preferably over a non-conductive base, in order to separate the circuit portions from the non-circuit portions; (b) the non-circuit portions are removed from the circuit portions of the conductive layer; and (c) the conductive portion is disposed over the non-conductive base and are subjected to pressure by a heated press which causes adherence of the conductive section to the base.

Another object of my invention is to provide a process as outlined above wherein the base and the conductive portion of the circuit are subjected to an intermediate drawing operation.

A further object is to provide a stamped circuit wherein the exposed section of the conductive layer is flush with the adjacent sections of the base which may be achieved by utilizing the above process.

Other objects, advantages and applications of my invention will be made apparent by the following detailed description of a preferred embodiment of my invention. The description makes reference to the accompanying drawings in which.

Figure 1:
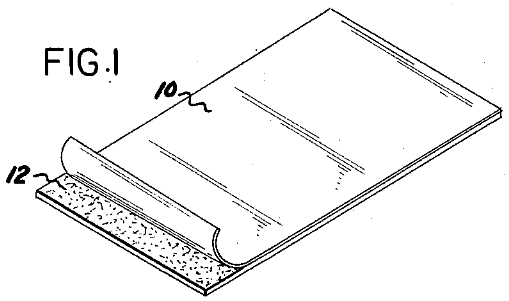
FIG. 1 is a perspective view of a base section with a conductive sheet laid over it preparatory to further processing.

Referring to the drawings, the basic components of the method and the finished circuit are a section of sheet or foil of conductive metal 10 and a non-conductive base 12. The metal 10 of which the conductive portion of the circuit is formed may constitute one, or a combination, of any of the metals which are commonly used for electrical conductors, such as copper, beryllium, stainless steel, aluminum, or the like. Composite materials such as silver plated on a copper base are often employed. The thickness of the metal sheet 10 is a function of the current level at which the circuit is to be employed and while a thin foil is normally used, high current applications may require a relatively thick metal sheet.

The essential characteristic of the base 12 is that it be non-conductive. Plastics are most commonly employed because of their excellent insulation properties and their ability to flow under pressure. Either thermosetting or thermoplastic varieties may be employed.

If the base 12 is formed of a thermosetting material which is cured prior to use with the present invention, some adhesive means must be employed to attach the metal 10 to the base. This may take the form of a coating of an uncured thermosetting adhesive on the side of the metal sheet 10 which is disposed in contact with the base 12, or this adhesive may be applied between the metal and the base at a subsequent stage in the process.

If a thermoplastic base material is employed, adhesion may be obtained between the base and the metal 10 by mechanical insertion of the edges of the metal into the flowing plastic at a subsequent stage in the process. In the present invention I prefer to employ an uncured thermosetting plastic such as a phenol resin impregnated in a base formed of a fabric, paper, or other fiber. Other thermosetting resins which may be employed include silicone, melamine, epoxy, and polyester. This plastic is available in roll form in thin sections which enhances its use in high production processes. When an uncured thermosetting plastic is employed, it is not necessary to use an additional thermosetting adhesive since the setting of the plastic while in contact with the metal retains the metal to the surface.

Figure 2:
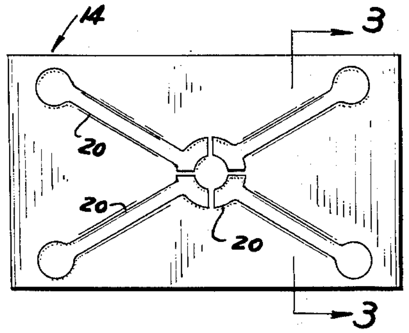
FIG. 2 is a plan view of a cutting die which may be used to form a stamped circuit of a particular configuration.
Figure 3:
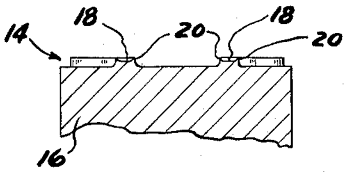
FIG. 3 is an elevational cross section view of the cutting die taken along lines 3—3 of FIG. 2.

As a first step in the process, the desired section is stamped out of the metal sheet 10 by a die of the type shown in FIG. 2 or 3. This cutting die, generally indicated at 14, may be heated by suitable means such as steam passages, dielectric or electric induction heating, or by electrical resistance elements disposed within the die. The primary purpose of the die is to cut the circuit out of the metal but the die is preferably heated to a moderate temperature so as to secure a slight adhesion between the metal 10 and the base 12. Thus, in the preferred process, the metal 10 is disposed on the base 12 and they are operated upon by the die 14 against a flat surface. This separates the desired circuit portions from the non-circuit portions of the metal and also provides a slight adhesion of the circuit to the metal.

In alternate processes, the metal may be stamped from the foil independently and later brought into juxtaposition with the base 12.

The cutting die illustrated in FIGS. 2 and 3 is constructed so as to form a particular circuit, the nature of which is not of importance to the invention. As may be best seen in FIG. 3, the die is formed about a base 16 and has cutting sections 18 raised above the normal die surface. The actual cutting is done by sharpened ridges 20 which border each of the die segments. The backing die (not shown) is preferably flat in construction but when heavier metal sections are used a mating configuration may be formed thereon.

Figures 4, 6:
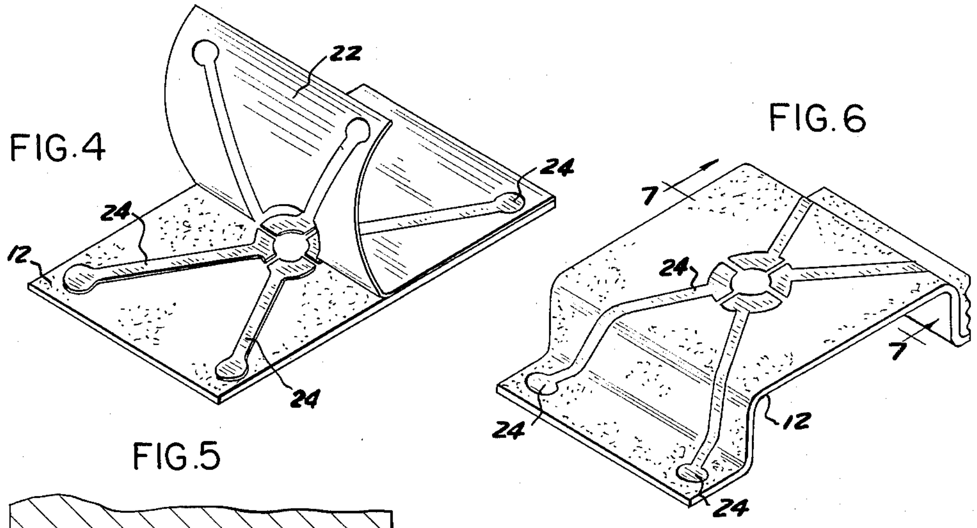
FIG. 4 is a perspective view of the composite unit of FIG. 1 after forming by the die of FIG. 2 illustrating the manner of removing the non-circuit section.
FIG. 6 is a perspective view of a finished three-dimensional circuit embodying the inventive concept and formed in accordance with the novel method.
Figure 5:
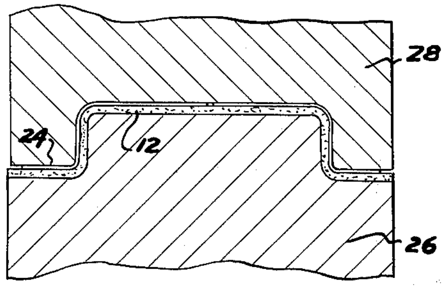
FIG. 5 is a cross-sectional view of a draw die which may be used to form the present circuit in three dimensions and also represents the cross section through a separate die which may be used to heat the formed circuit.

Following the removal of the metal 10 and the base 12 from the press which utilizes the cutting die, the non-circuit portion of the metal is stripped from the base. This may be done manually as is illustrated in FIG. 4 wherein the non-circuit portion 22 is shown partially removed leaving the circuit portion 24. The circuit portions 24 are preferably lightly adhered to the base 12 at this point either because of the imbedding of the edges of the printed portion 24 in the base material 10 as a result of the die forces or a phenol adhesive action as a result of the contact of the cutting portion 18 of the die with the circuit portion 24. In either event this should be rather a loose connection such as might be removed by hand, but of sufficient force to retain the circuit portion 24 as the non-circuit portion 22 is stripped from the base.

The base 12 and the circuit portions 24 are next subjected to a three-dimensional forming action as by a male and female drawing die 26 and 28, respectively. This die forming action is most easily applied with the preferred embodiment utilizing uncured plastic impregnated in a fiber for the base material 12. However, it may also be performed with other ductile bases 12 or with a thermoplastic base if a heated die is utilized. The characterizing nature of the forming action is a distortion of the base material, including a section to which the circuit portion 24 is attached, out of its plane configuration. Such drawing action normally distorts the metal circuit section 24 to a different degree than it distorts the base 12. Accordingly, if the metal 24 were firmly adhered to the base 12, either a tearing or buckling action would occur. The fact that the circuit section 24 is loosely adhered to the base 12 following pressing in the die 16 allows this three-dimensional forming action to be conductive. The formed base 12 of the circuit section 24 is then removed from the forming dies 26 and 28 and disposed in another set of dies which appear substantially identical to dies 26 and 28 and therefore are not illustrated. They differ only in that they provide a looser fit to the formed section and are heated to a sufficient temperature to thermally set the circuit portion 24 to the base 12. In some instances the temperature required to thermally set the circuit portion 24 to the base 12 could be ambient temperature, or could be below ambient temperature. This setting may occur from a thermosetting adhesive or from the curing of a thermosetting base 12. It may also take the form of a secure imbedding of the circuit 24 and a thermoplastic base 12 and its retention by mechanical action.

Figure 7:
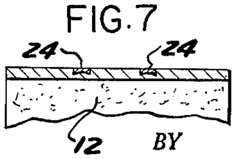
FIG. 7 is a cross-sectional view of the finished circuit taken along lines 7—7 of FIG. 6.

FIGS. 6 and 7 illustrate the finished three-dimensional stamped circuit after being removed from the heating dies. It will be noted that the combined action of the cutting die 16, forming dies 26 and 28, and the heating dies have pressed the circuit portion 24 into the base 12 to an extent that its upper surfaces are flush with that of the surrounding base. It should be recognized that in certain circumstances in applications such flush action is not desirable and is not accomplished by the process.

Having thus described my invention, I claim:

1. The method of manufacturing an electric circuit element which consists of conductive segments disposed about a surface of a non-conductive base, comprising: disposing a sheet having at least one conductive layer in parallel contiguous relation to a sheet of uncured thermosetting plastic; die stamping said sheets so as to separate the circuit portions of the conductive sheet from the non-circuit portions thereof and simultaneously applying heat to said circuit portions to a sufficient degree as to cause them to loosely adhere to said plastic sheet but in less than sufficient degree to cause curing of the plastic sheet; stripping the non-circuit portions of said conductive sheet from said plastic sheet; and applying heat and pressure to said sheets to cause said plastic sheet to cure and said circut portions of said conductive sheet to firmly adhere to said plastic sheet.

2. The method of forming a stamped, three-dimensional circuit, comprising: disposing a sheet having at least one conductive layer in parallel contiguous relationship to a base of an uncured thermosetting plastic disposed in a fibrous matrix; die stamping said sheet so as to cause separation of the circuit portion thereof from the non-circuit portion, and to cause loose adherence of said circuit portion to said base; stripping said non-circuit portion from the circuit portion and the base; forming said circuit portion and said base in a non-planar configuration; and exerting heat and pressure on said formed circuit portion and base to cause the curing of said base and the firm adherence of said circuit portion thereto.

References Cited by the Examiner

UNITED STATES PATENTS

| | | | |
|---|---|---|---|
| 636,203 | 10/99 | Helberger. | |
| 1,646,613 | 10/27 | Courtenay | 156—251 |
| 2,184,121 | 12/39 | Henriksen | 156—224 |
| 2,381,134 | 8/45 | Newmark | 156—221 |
| 2,622,054 | 12/52 | Franklin | 156—251 |
| 2,647,852 | 8/53 | Franklin | 156—251 |
| 2,969,300 | 1/61 | Franz | 156—233 |
| 3,039,177 | 6/62 | Burdett | 29—155.5 |

EARL M. BERGERT, *Primary Examiner.*